(12) United States Patent
Francis

(10) Patent No.: US 10,178,787 B2
(45) Date of Patent: Jan. 8, 2019

(54) HEADER FOR MOUNTING A PLANAR TRANSFORMER ON A MOTHERBOARD

(71) Applicant: Murata Manufacturing Co., Ltd., Nagaokakyo-shi, Kyoto-fu (JP)

(72) Inventor: Lee Francis, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 96 days.

(21) Appl. No.: 14/858,317

(22) Filed: Sep. 18, 2015

(65) Prior Publication Data

US 2016/0088754 A1 Mar. 24, 2016

(30) Foreign Application Priority Data

Sep. 19, 2014 (GB) .................................. 1416626.8

(51) Int. Cl.
*H05K 7/02* (2006.01)
*H05K 13/04* (2006.01)
*H01F 27/30* (2006.01)
*H05K 3/30* (2006.01)

(52) U.S. Cl.
CPC .......... *H05K 7/026* (2013.01); *H01F 27/306* (2013.01); *H05K 3/301* (2013.01); *H05K 13/04* (2013.01); *H05K 2201/1003* (2013.01); *H05K 2201/10303* (2013.01); *H05K 2201/10424* (2013.01)

(58) Field of Classification Search
CPC ........ H05K 7/026; H05K 3/301; H05K 13/04; H05K 2201/10424; H05K 2201/1003; H05K 2201/10303; H01F 27/306

USPC .................................................. 361/782, 752
See application file for complete search history.

(56) References Cited

U.S. PATENT DOCUMENTS 3,360,752 A * 12/1967 Uptegraff, Jr. ........ H01F 27/022
174/16.1
6,060,974 A 5/2000 Schroter et al.
6,466,454 B1 10/2002 Jitaru
(Continued)

FOREIGN PATENT DOCUMENTS

WO 01/91142 A1 11/2001
WO 2011/154993 A1 12/2011
WO 2014/111994 A1 7/2014

OTHER PUBLICATIONS

Official Communication issued in International Patent Application No. GB1416626.8, dated Mar. 20, 2015.
(Continued)

*Primary Examiner* — Jinhee Lee
*Assistant Examiner* — Rockshana D Chowdhury
(74) *Attorney, Agent, or Firm* — Keating & Bennett, LLP

(57) ABSTRACT

A header for mounting a planar transformer on a motherboard provides electrical isolation and mechanical fixture. The header mechanically supports a coil and subsidiary circuit board of a planar transformer above a motherboard or main circuit board, at such clearance and creepage distances as to satisfy insulation requirements. The header includes a tray that holds the planar transformer coil and the mounting surfaces against which the main and subsidiary circuit boards rest. Retaining mechanisms allow the header to be secured to the planar transformer and allow the header to be secured to the main circuit board, for example, by soldering.

22 Claims, 12 Drawing Sheets

(56) References Cited

U.S. PATENT DOCUMENTS

| | | | |
|---|---|---|---|
| 2005/0052888 A1* | 3/2005 | Takeshima | H02M 7/003 363/147 |
| 2006/0082431 A1 | 4/2006 | Estrov | |
| 2007/0194875 A1 | 8/2007 | Wang et al. | |
| 2012/0099288 A1* | 4/2012 | Parish | H05K 1/145 361/782 |
| 2012/0235780 A1 | 9/2012 | Maple | |
| 2013/0328543 A1 | 12/2013 | Chen et al. | |

OTHER PUBLICATIONS

Official Communication issued in corresponding U.K. Patent Application No. GB1416626.8, dated Feb. 1, 2018.

* cited by examiner

HEADER FOR MOUNTING A PLANAR TRANSFORMER ON A MOTHERBOARD

BACKGROUND OF THE INVENTION

1. Field of the Invention

This application relates to a header for mounting a planar transformer on a motherboard, and in particular relates to a header for providing electrical isolation and mechanical fixture of the planar transformer.

2. Description of the Related Art

Planar transformers are commonly used in power supply units, and are often used on motherboards or main printed circuit boards (PCBs) in preference to other types of transformers when a low design profile is required. In these cases, the windings of the transformer can be incorporated into the main PCB, although this is at the expense of main PCB board area that could otherwise be used to mount other components related to the power supply circuitry.

As an alternative to incorporating the transformer windings directly into the main PCB, the transformer can instead be mounted above the PCB. This necessarily increases the design profile of the board because of the greater extent to which the planar transformer protrudes from it, but has the advantage that the footprint area that the transformer makes on the board can be reduced. This increases the amount of space on the board that can be used for mounting other components.

Whether fitting a transformer above a main PCB (or motherboard) or directly incorporating the windings into the main PCB, it is known that the transformer must be insulated from the components on the PCB to which it is mounted. This is especially important if the transformer forms part of a high-voltage isolated circuit. In this situation, industry standards, such as the EN/UL60950 standards guide, require that certain minimum clearance and creepage distances are maintained. Thus, the shortest distance between two conductive paths on the transformer and the PCB, as measured through air (also known as the clearance) must be maintained above the industry standard value. Similarly, the shortest distance between two conductive paths on the transformer and the PCB, as measured along the surface of the insulation (also known as the creepage) must also be maintained above the industry standard value.

It is known in the art to provide a thin insulator or "shim" between the transformer and the main PCB upon which it is mounted. Subject to the shim having a certain minimum thickness, the requirements regarding clearance and creepage can be met using this technique. However, the use of a shim is often not ideal as it provides poor structural support to the transformer, and makes the manufacture of the circuit boards difficult, especially if automated soldering techniques such as reflow soldering are used.

It is also known in the art to completely encapsulate and seal the transformer in an epoxy resin or similar material before mounting it to the main PCB. However, such a technique is again unsuitable for reflow soldering techniques due to migration of solder into the epoxy resin, and the possibility of voids forming in the epoxy which, during reflow soldering, can expand and lead to a failure of the device.

It is desirable to provide an improved mounting of a planar transformer on a motherboard.

SUMMARY OF THE INVENTION

A preferred embodiment of the present invention provides an electronic device including: a header including an insulating header body including an upper mounting surface and a lower mounting surface; a first substrate mounted to the upper mounting surface, the first substrate including a transformer including a core, input electrical windings, and output electrical windings, the input electrical windings and the output electrical windings being isolated; a second substrate mounted to the lower mounting surface, the second substrate including: input circuitry including one or more electrical components in communication with the input electrical windings; output circuitry including one or more electrical components in communication with the output electrical windings; a first connector provided through the insulating header body, the first substrate, and the second substrate and connecting the input circuitry to the input electrical windings; a second connector provided through the insulating header body, the first substrate, and the second substrate and connecting the output circuitry to the output windings; wherein the second substrate has a first isolation gap between the input circuitry and the output circuitry; wherein the first substrate has a second isolation gap between the core and the first connector and between the core and the second connector; and wherein the insulating header body has an isolation barrier between the core the input circuitry and between the core and the input circuitry.

The electronic may further include: a first cavity in the insulating header body in which at least part of the core is housed.

The electronic device may further include: a second cavity in the insulating header body at the opposite side of the first cavity, in which the electrical components of the input and output circuitry are housed.

The isolation barrier may include a top and a bottom surface defining a side wall of the first and second cavities.

The header may include one or more upper side walls extending from the upper mounting surface.

The first cavity may include one or more drain holes.

At least one wall of the cavity is sloped to direct liquid towards the one or more drain holes.

The electronic device may further include a lower side wall extending from the insulating header body to the second substrate. The lower side wall may encapsulate the one or more drain hole. This maintains the isolation between the top side of the header and the bottom side.

The lower surface of the lower side wall may be coplanar with a lower mounting surface of the insulating header body.

The first and second connectors may include: a plurality of pins joined to the insulating header body and engaged with corresponding holes in the first and/or second substrates.

The pins may be arranged to be secured to the first and/or the second substrates by soldering.

One or more clips may be attached to the insulating header body, the clips engage with the first and/or second substrates.

The electronic device may further include at least one sacrificial protrusion that extends from the upper mounting surface and/or lower mounting surface, and that applies a force to the first and/or second substrate to hold the substrate against the one or more clips.

The header may include one or more further lower mounting surfaces, each further lower mounting surface being coplanar with the lower mounting surface.

The electronic device may further include secondary holes provided in the upper mounting surface.

The header of the electronic device may be made of a high-temperature plastic.

The high-temperature plastic may be suitable for withstanding the thermal profile of a reflow soldering process.

The thickness of material from which the header is constructed is substantially equal to 0.4 mm.

The electronic device may include a header with exterior walls and surfaces that are substantially orthogonal to each other so that the header has a substantially square or rectangular profile.

A preferred embodiment of the present invention provides a method of mounting a planar transformer including a subsidiary circuit board to a main circuit board, including: engaging the planar transformer with the header; mounting the planar transformer to a main circuit board using the header, by: securing the subsidiary circuit board to the upper mounting surface of the header, and securing the at least one lower mounting surface of the header to the main board.

The method may further include mounting the header with secured planar transformer and main PCB to a motherboard.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will now be described in the context of a power supply unit including a header for mounting a planar transformer and main PCB (printed circuit board). More generally, however, the preferred embodiments of the present invention are suitable for use in any situation requiring the mounting of a planar transformer or inductor to a main PCB.

First Preferred Embodiment

Figure 1:
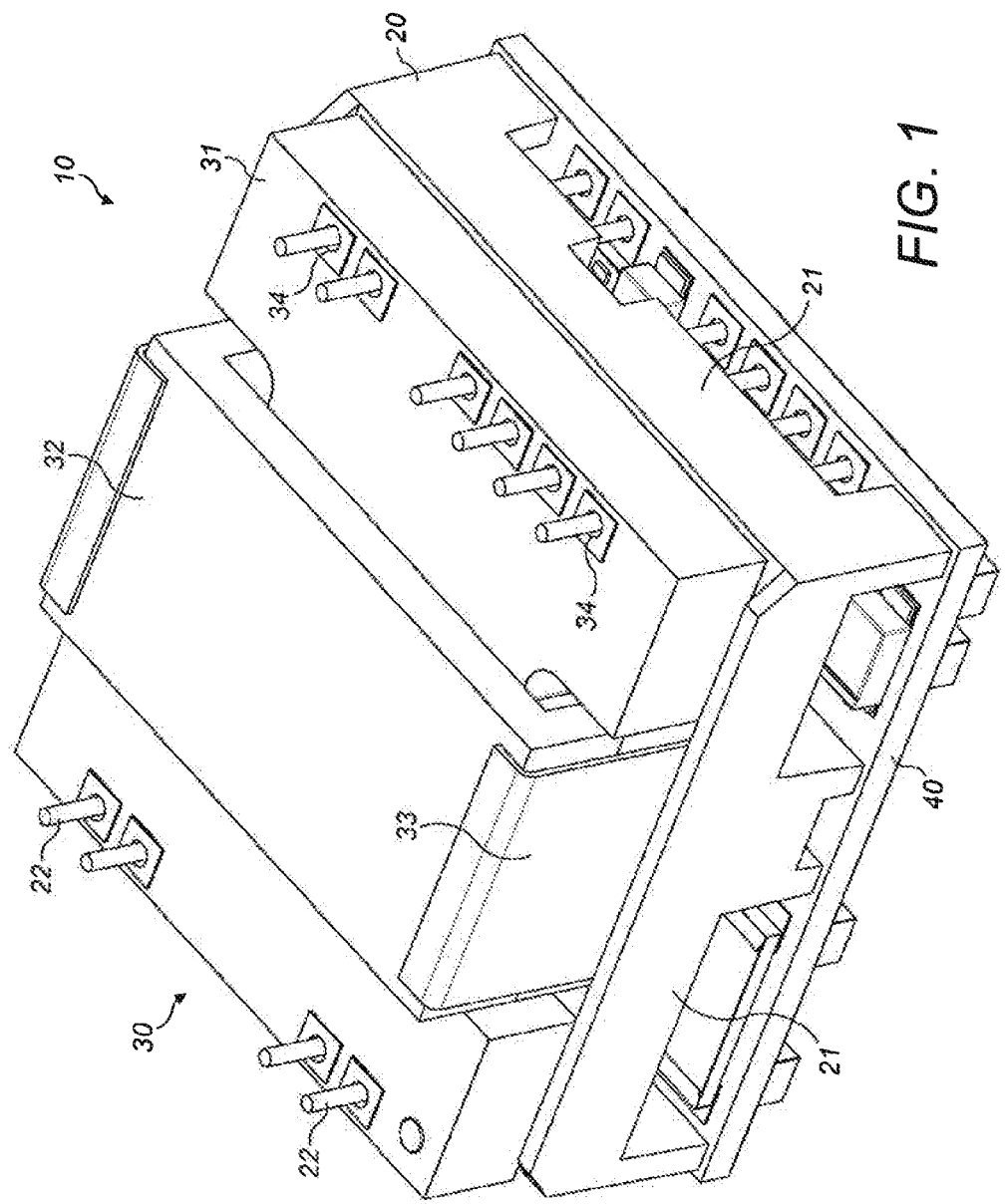
FIG. 1 illustrates a first preferred embodiment of the present invention of a header with a planar transformer and main printed circuit board mounted in position.
Figure 2:
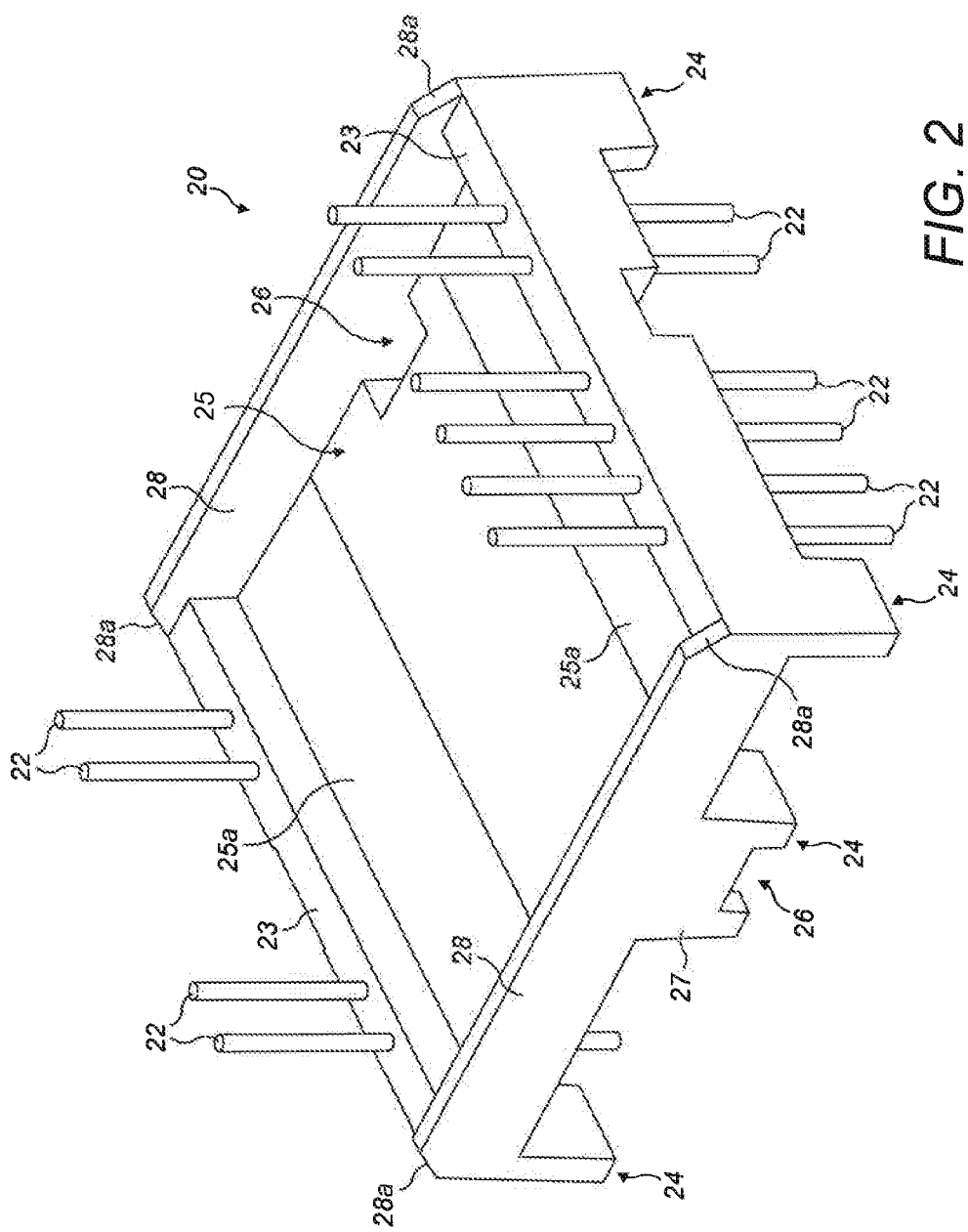
FIG. 2 illustrates a perspective view of the top of the header according to the first preferred embodiment of the present invention, with the planar transformer and main printed circuit board omitted.
Figure 3:
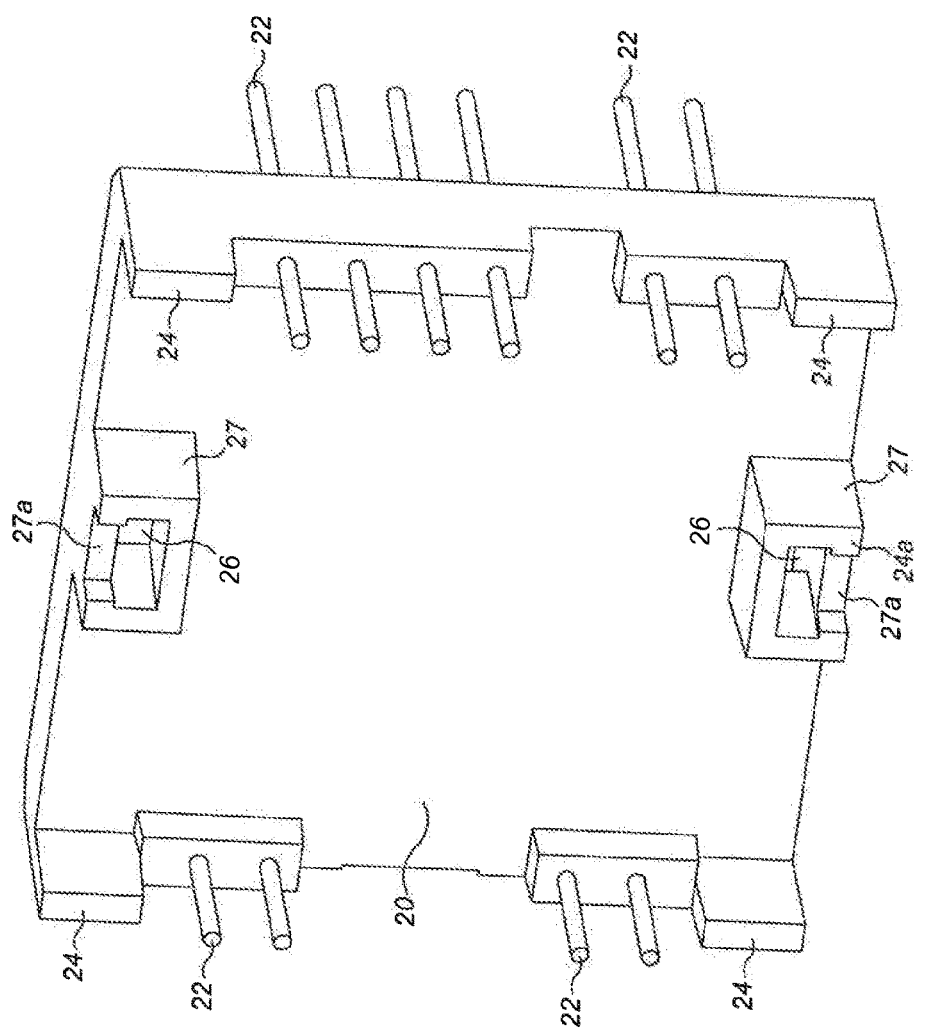
FIG. 3 illustrates a perspective view of the bottom of the header according to the first preferred embodiment of the present invention, with the planar transformer and main printed circuit board omitted.
Figure 4:
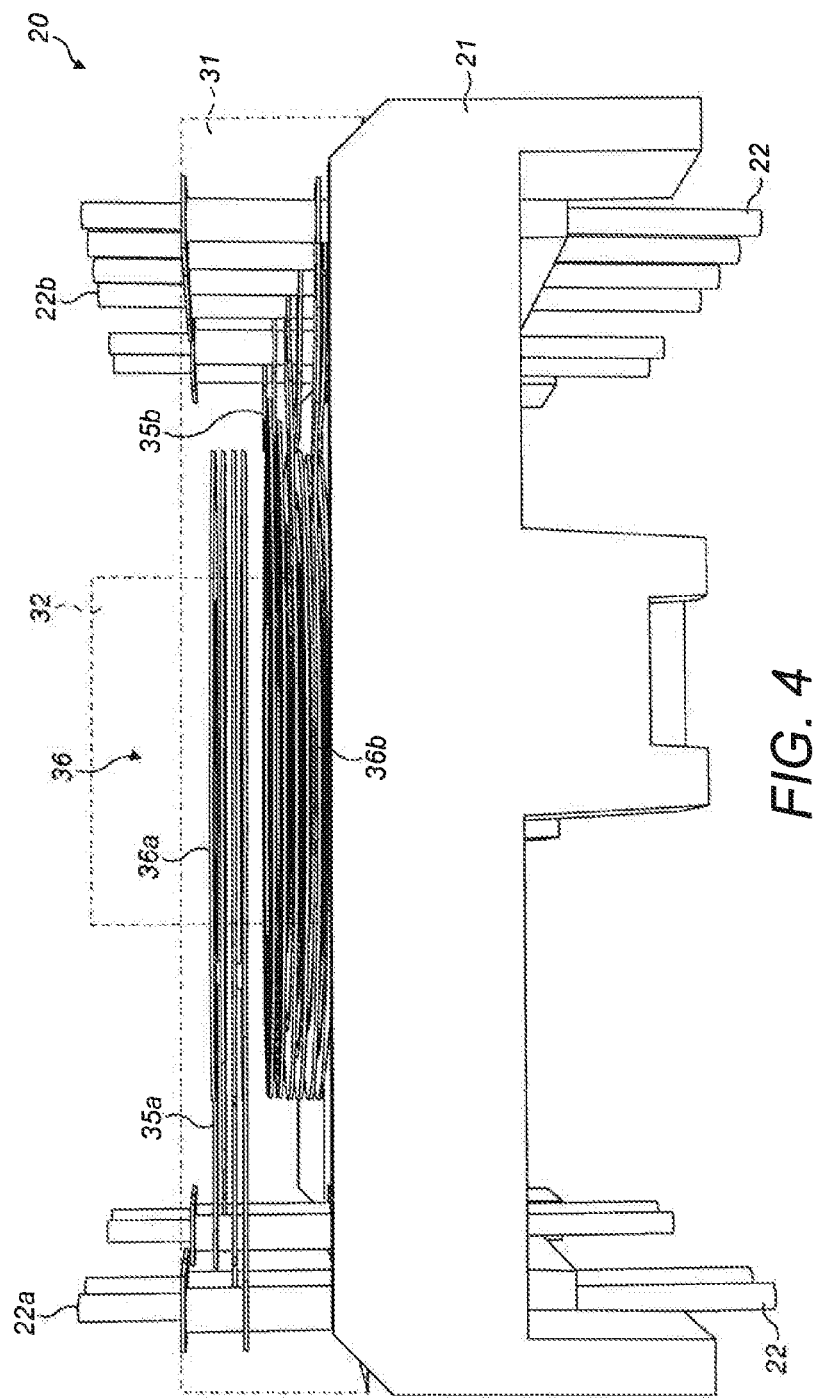
FIG. 4 shows an exploded perspective view through the planar transformer illustrating the transformer windings.
Figure 5:
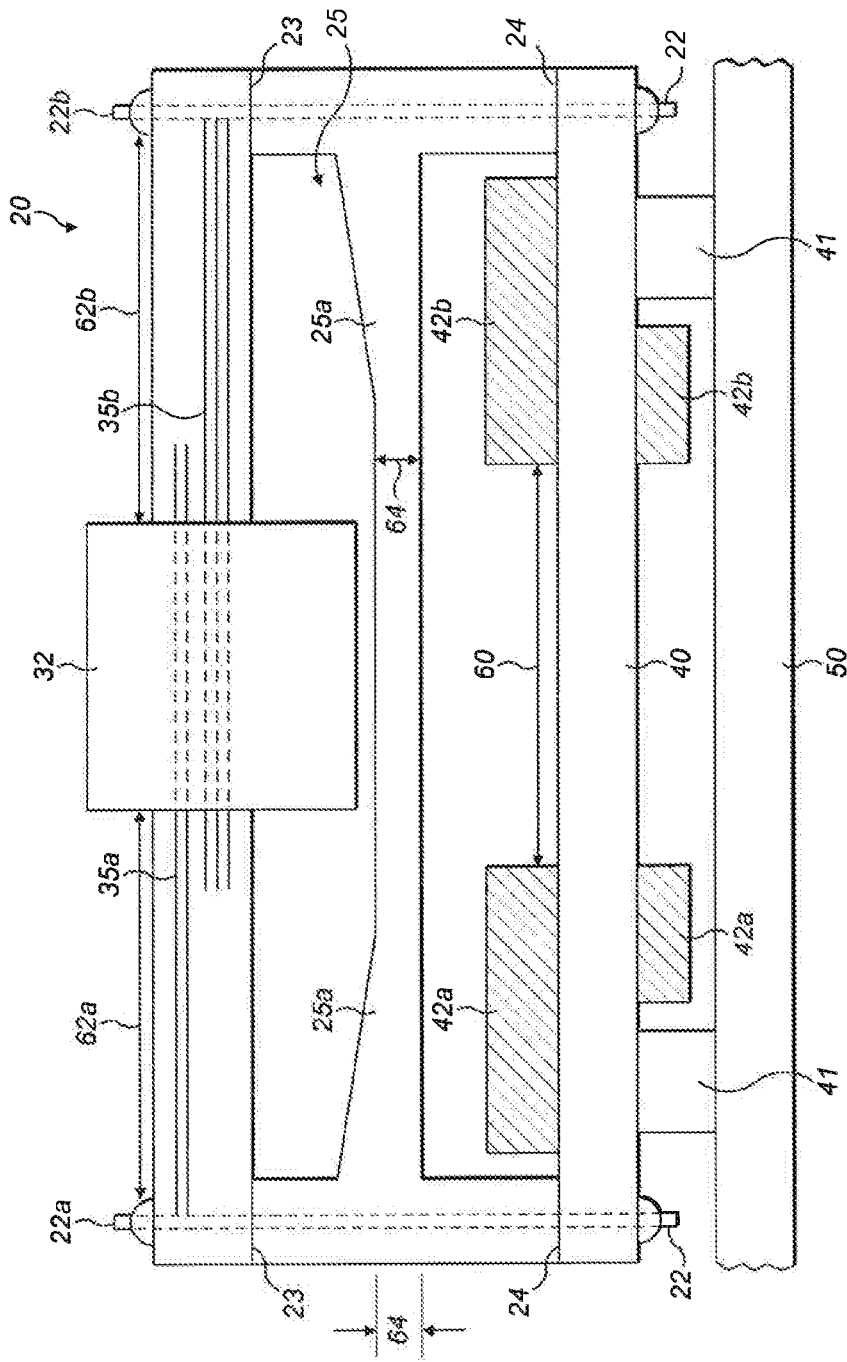
FIG. 5 is a cross-sectional view through the header of the first preferred embodiment of the present invention.

FIG. 1 illustrates a complete power supply unit 10 including a header 20, a planar transformer 30 including substrate or first substrate 31, and a main PCB or second substrate 40. FIGS. 2 and 3 illustrate the header 20 without the planar transformer 30 or main PCB 40 from different views. FIG. 2 shows a perspective view of the top side of the header 20, and FIG. 3 shows a perspective view of the bottom side of the header 20. FIG. 4 shows a cross-sectional view through the planar transformer illustrating the transformer windings, including primary coil or input electrical windings 36a and secondary coil or output electrical windings 36b. FIG. 5 shows a cross section of the header 20. In FIGS. 1 to 5, like reference signs denote the same features.

As can be seen in FIG. 1, the header 20 includes a plurality of side walls 21 and electrical connectors 22, passing from the top to the bottom of the header 20 and providing both mechanical and electrical connections by which the planar transformer 30 and the main PCB 40 are connected to the header 20 and to each other.

Planar transformer 30, which is a type of transformer, includes a substrate 31 and a surrounding magnetic core 32, which is a type of core. The magnetic core 32 may be made of a ferrite material for example and may be secured in place in the header 20 by clips 33. The substrate 31 is typically a single piece of resin material that passes through the magnetic core 32 from an input side to an output side.

As shown more clearly in FIG. 4, substrate 31 includes a plurality of planar wound transformer windings 35a, 35b located in its interior surrounded by the magnetic core 32. In FIG. 4, the substrate 31 and magnetic core 32 are omitted but their position is shown with broken lines. The transformer windings 35a, 35b are made up of copper traces in a coil arrangement 36. In this preferred embodiment, the coil arrangement 36 has a winding axis that is perpendicular or substantially perpendicular to the top and bottom surfaces of the substrate 31 to thereby define the windings of the planar transformer. The coil arrangement 36 includes primary coil windings 36a connected to the input or primary side connectors 22a of the header 20 by traces 35a (the left hand side in FIG. 4), and secondary coil windings 36b connected to the output or secondary side connectors 22b of the header 20 by traces 35b (the right hand side in FIG. 4). The connectors 22 may pass through the substrate 31 at plated via holes 34. The plated via holes 34 and the connectors 22 thread through the substrate 31 from one side of the substrate 31 to the other. Thus, electrical connections are able to be conveniently made to the copper traces 35a and 35b located in the interior of the substrate 31 and different vertical positions, irrespective of their vertical position within the substrate 31.

Pads may be provided on both the planar transformer substrate 31 and the main PCB 40 in such a way as to enclose each via hole 24. This allows the connectors 22 to be permanently connected to the planar substrate 31 and main PCB 40 by soldering.

The transformer windings in the substrate 31 and the traces leading to the output terminals are located sufficiently far from the outside edges of substrate 31 to meet any desired isolation requirements. The only exposed components of the planar transformer that are conductive are therefore the magnetic core 32 and the via holes 34 and connections at connectors 22.

Main PCB 40 includes control circuitry that controls the transformer. The control circuitry is divided into two sections, one associated with the input (primary) side of the transformer and the other associated with the output (secondary) side of the transformer. The control circuitry on the main PCB 40 is discussed schematically below in relation to FIG. 5.

FIG. 2 is an isometric view of the top of the header 20, without the planar transformer 30 or the main PCB 40 shown. The header 20 includes upper mounting surfaces 23 that contact the substrate 31 of the planar transformer 30, and a plurality of lower mounting surfaces 24 that extend downward from the header body 20 to contact the main PCB 40. As can be seen here, the header 20 is substantially square or rectangular in shape when viewed along a direction orthogonal to the plane of the upper mounting surface 23. Making the walls and surfaces of the header 20 perpendicular or substantially perpendicular to each other, so that the device has a substantially square or rectangular profile, aids gripping of the header 20 by a pick and place machine during assembly.

The plurality of lower mounting surfaces include a lower mounting surface 24 provided at each corner of the header body 20, and two further square-U-shaped lower mounting surfaces 24a provided midway along two opposing edges of the header 20. As will be seen with reference to FIG. 5, the distance between the lower mounting surfaces 24 and the header body 20 defines a cavity under the header 20 in which components on the main PCB 40 may be accommodated. The position of the square U-shaped lower mounting surfaces will further be understood to fall within an isolation gap provided between the input and output circuitry on the main PCB 40.

The side walls 21 and the header body 20 have a minimum wall thickness which is maintained the whole way around the complete power supply unit. A suitable minimum wall thickness is, for example, 0.4 mm. Such a thickness is chosen so as to ensure that the walls are sufficiently rigid to enable them to adequately support the planar transformer 30. They also ensure that the required electrical insulation, parameterized by minimum clearance and creepage distances, is provided by the header 20.

On the top of the header 20, a tray or cavity 25 is provided between the upper mounting surfaces 23 to accommodate the planar transformer 30 and the core 32. Drain holes 26 are provided in the tray 25 to enable liquid used in cleaning the header, PCBs, and planar transformer to drain away. The drain holes 26 are defined in the header 20 by openings in the tray 25 on the top of the header 20, and side walls 27 that extend from the top of the header 20 to the bottom of the header 20, where they terminate in the U-shaped mounting surface 24a mentioned above. The surface of the tray 25 may include sloped sections 25a to assist any liquid in draining towards the holes 26.

Pins or connectors 22 are provided through the side walls 21 of the header 20 and enable both the substrate 31 of the planar transformer 30 and the main PCB 40 to be secured to the header 20.

Two raised side walls 28 are provided along those edges 21 of the header which do not have the connectors or pins 22 protruding from them. The raised side walls 28 further define a recess or cavity for the planar transformer 30 and assist in holding it in position within the header 20 and preventing lateral movement. In the present preferred embodiment, the corners 28a of the side walls 28 are rounded off or cut at an angle to avoid having a sharp corner, and to reduce slightly the profile of the header.

A bottom view of the header is shown in FIG. 3 to which reference should now be made. The side walls 27 of the drain holes 26 can be seen in more detail, as can the mounting surfaces 24 and 24a. The cavity or recess for housing the circuitry located on the main PCB 40 can therefore be understood as the space between the respective mounting surfaces 24 and side walls 27 as they project from the underside of the header 20.

The operation of the power supply unit 10 will now be described with reference to FIG. 5, which shows a cross-sectional view of the header 20 with the planar transformer 30 and the main PCB 40 mounted. The main PCB 40 is also shown as mounted via main PCB supports 41 onto a third-party motherboard 50.

As shown in FIG. 5, one main PCB support 41 is provided close to each end of the main PCB 40. In other preferred embodiments of the present invention, only a single main PCB support may be provided, or more than two main PCB supports 41 may be provided. Main PCB 40 includes control circuitry 42a, 42b, and in particular has mounted upon it electrical components relating to the input and output of the transformer coil provided in planar transformer 30. These components may be mounted above and/or below the main PCB 40. In the preferred embodiment of FIG. 5, the electrical components represented schematically by shaded regions 42a relate to the input side of the transformer windings and are respectively mounted above and below the main PCB 40. Similarly, the electrical components represented schematically by shaded regions 42b relate to the output side of the transformer windings and are also respectively mounted above and below the main PCB 40. Because the input and output sides of the transformer require electrical isolation from one another, it is necessary to position the input side components 42a away from the output side components 42b, separating them by an isolation gap or distance 60. These components must also be sufficiently isolated from the motherboard 50. This can be achieved by ensuring that the main PCB 40 is kept clear of tracks and components immediately below the main PCB on the motherboard 50.

The header 20 includes lower mounting surfaces 24 which make contact with the main PCB 40. In the cross-sectional view of FIG. 5, one such lower mounting surface 24 is shown at either end of the main circuit board 40. The header 20 also has upper mounting surfaces 23 upon which planar transformer substrate 31 rests. Again, one such upper mounting surface 23 is shown at either end of the header 20. Passing through each end of the header 20, from the upper mounting surface 23 to the lower mounting surface 24 and extending outwards from both of these surfaces are mounting pins 22. These pins 22 are shown with dashed lines where they pass through the header 20 or the substrate 31 and main PCB 40. Viewed from the top of FIG. 5, mounting pins 22 are soldered onto the planar transformer substrate 31 passing through holes drilled within the substrate 31. They then pass through the upper mounting surfaces 23 of the header 20, continuing through the header material and emerging at the lower mounting surfaces 24. The pins 22 then pass through holes drilled within the main PCB 40 and are soldered to the lower surface of main PCB 40 as shown. Therefore at least two electrical connections are made between the main PCB 40 and the planar transformer substrate 31. In this case, the input side of the planar transformer is shown as connecting to connectors 22a and the output to connectors 22b.

Although not visible in the earlier figures, the windings 35a, 35b of the planar transformer are shown schematically within the substrate 31 in FIG. 5.

In this preferred embodiment, the pin 22a on the left of FIG. 5 is connected, via tracks (not shown) on the main PCB 40, to input circuitry components 42a. The pin 22b on the right of FIG. 5 is similarly connected, via tracks (not shown) on the main PCB 40, to output circuitry components 42b. Therefore, just as a first isolation distance 60 is required between input 42a and output 42b electrical components, so too is second isolation distance 62a, 62b required between the left-hand pin 22a and the right hand side or output pin 22b on the top side of the header 20. As explained earlier, the only conductive components of the planar transformer that are exposed are connectors 22a and 22b and magnetic core 32. As the magnetic core 32 is itself a conductive material located between the pins 22a and 22b, the second isolation distance 62a, 62b between pins 22a and 22b is represented more accurately as the sum of the distance between pin 22a and the core 32, and the distance between the core 32 and the pin 22b. This is illustrated by reference numbers 62a and 62b. Thus, if the first isolation distance 60 is 7 mm, for example, the distance between the connectors 22a and 22b, and the core 32 should be 3.5 mm, for example.

It should be noted that if the pads are provided around via holes 34, the second isolation distance will be the distance between the core 32 and the pads. As the pads are electrically connected to the connectors 22a or 22b, the pads 34 can be interpreted as part of the first connector or the second connector in such a case.

As shown in FIG. 5, the tray 25 extends between the side walls 21 and separates the planar transformer 30 and the core 32 from the circuitry 42a, 42b mounted on the main PCB 40 below. The height of the side walls 21 where they extend above the tray 25 allows a variety of transformer core 32 sizes to be accommodated within the tray. The thickness of tray 25, indicated by arrow 64, acts an isolation barrier between the transformer core 32 and the components 42a, 42b mounted upon the main PCB 40. In preferred embodiments of the present invention, this isolation barrier 64 has a thickness of at least about 0.4 mm, for example. Thus, the isolation barrier 64 is able to serve as a cemented joint between the planar transformer 30 and the main PCB 40.

As can be seen with reference to FIG. 3, where drain holes 26 are provided in the tray 25, the side walls 27 are designed to extend sufficiently far from the tray 25 to meet the surface of the main PCB 40 and act as a mounting surface at which main PCB 40 can be connected. This avoids any gap between the side walls 27 and the main PCB 40 which could otherwise reduce the length of the isolation path between the magnetic core 32 and the input 42a or output 42b circuitry. For this reason, although a gap 27a may be provided in the side walls 27 where the side walls face the exterior of the header 20, and so away from the input 42a and output 42b side circuitry, this gap 27a is not provided facing towards the interior of the main PCB 40. It will also be appreciated that the side walls 27 and the drain holes 26 are not necessarily provided in the center of the tray 25. The positioning of the drain holes 26 and the side walls 27 is instead dependent on the positioning of the isolation gap 60 provided between the input 42a and output 42b circuitry of the main PCB 40.

The side walls 28 that define the passage of drain holes 26 through the header 20 should have the same thickness as the isolation barrier 64. This ensures that the isolation provided by a second isolation distance 62a, 62b is not lessened or weakened by the presence of the side walls 27 extending through the second isolation distance 62a, 62b. Thus, the one or more drain holes 26 can be provided in the isolation barrier 64 to prevent cleaning solvents or other liquid becoming trapped in the tray 25, providing the position of drain holes 26 within the isolation barrier 64 is chosen to ensure that sufficient electrical isolation between the core 32 and components 42a, 42b remains, while still allowing efficient drainage from the tray 25.

Second Preferred Embodiment

A second preferred embodiment 100 of the present invention will now be described with reference to FIGS. 6 to 8.

As in the previous preferred embodiment of the present invention, power supply unit 100 includes a planar transformer 106, a header 120, and a main PCB 102. The planar transformer 106 includes a magnetic core 108 supported on and around a planar substrate 110 including a plurality of planar input and output windings. The header 120 includes main body 121 including a number of walls and surfaces providing an upper mounting surface 128 with which the planar transformer 106 makes contact, as well as side walls 130 which are positioned so as to contact the sides of the planar transformer 106 and hold it in position laterally. In this preferred embodiment, extended side walls 130 and optional clips 140 provide further mechanical support for the planar transformer when it is mounted on the header 120. The isolation distance 121a between the top and the bottom of the header body 121 ensures that the required electrical isolation requirements are met, and separates components mounted on the planar PCB and/or the planar transformer from those components mounted on the main PCB 102 thereby insulating these components from one another.

The upper mounting surface 128 and side walls 130 define a recess in which the magnetic core 108 is received. As before the magnetic core surrounds the substrate 110 of the planar transformer 106. The side walls 130 and the header body 121 have a minimum wall thickness 126 which is maintained the whole way around the complete power supply unit. A suitable minimum wall thickness is about 0.4 mm, for example. Such a thickness is chosen so as to ensure that the walls are sufficiently rigid to enable them to adequately support the planar transformer 106. They also ensure that the required electrical insulation, parameterized by minimum clearance and creepage distances, is provided by the header 120.

In addition to the upper mounting surfaces 128 and side walls 130, a number of lower mounting surfaces 132 are provided which contact the main PCB 102. In the preferred embodiment of FIG. 6, in which the header 120 is square or rectangular in shape when viewed orthogonally to the plane of the main PCB 102, a lower mounting surface 132 is provided at each of the four corners of the header 120. Further lower mounting surfaces 132 are also provided midway along two opposing edges of the header 120, and are best seen in the view of FIG. 7. These further lower mounting surfaces 132 may be square-U-shaped, for example, and as before, allow drain holes 152, to be provided in the header body.

The lower mounting surfaces 132 extend out from the base 121b of the header main body 121. Together, the base 121b and the lower mounting surfaces 132 form a cavity or recess in which components of the main PCB can be accommodated.

In this preferred embodiment, the walls and surfaces of the header 120 preferably are perpendicular or substantially perpendicular to each other, so that the device has a substantially square or rectangular profile. This aids gripping of the header 120 by a pick and place machine during assembly.

The header 120 engages with both the main PCB 102 and also with the planar transformer 106. As before, a plurality of mounting pins 122 are rigidly connected to header body 121. The mounting pins 122 protrude vertically above and below the header body 121, and may be provided at one or more edges of the header body 121. The mounting pins 122 are designed to pass through holes 124 drilled within both the main PCB 102 and planar PCB 110, such that the main PCB 102 and planar PCB 110 are securely fastened to the header 120. Note that, for clarity, not all of the holes 124 are labelled in FIGS. 6 to 8. Pins 122 pass through holes 124 when the complete power supply unit is assembled. Such assembly involves mounting the header 120 to main PCB 102 such that the downwardly pointing pins pass through the main PCB holes and the header is in contact with the main PCB 102, and furthermore engaging the planar transformer 106 with the header 120 such that the upwardly pointing pins pass through with the planar PCB holes and the planar transformer 106 is in contact with the header 120. More details relating to the portions of the header 120 that make contact with the PCBs are given below. Pads are provided on both the main PCB 102 and planar PCB 110 in such a way as to enclose each hole 124. This allows the pins 122 to be permanently connected to the main PCB 102 and/or planar PCB 110 by soldering.

In this preferred embodiment, one or more upper clips 140 and one or more lower clips 142 are attached to the body 121 of header 120. The upper and lower clips act to secure both the planar PCB 110 and the main PCB 102 to the upper 128 and lower 130 mounting surfaces respectively. Both the upper 140 and lower 142 clips have the same or substantially the same shape, and include a protrusion extending from the body 121 of the header 120 to the opposite end of the planar transformer 106 or the main PCB 102, and a wider clip head section which partly extends over the surface of the PCB, defining a lip. The upper 140 and lower 142 clips are described in more detail later in relation to FIG. 10. Multiple upper 140 and lower 142 clips are provided to hold the planar transformer 106 and main PCBs 102 securely. In some preferred embodiments, only upper clips 140 are provided, or only lower clips 142 are provided. The main PCB 102 can include one or more main PCB supports 104 that can be used to mount the main PCB 102 to a third-party motherboard (not shown).

Figure 6:
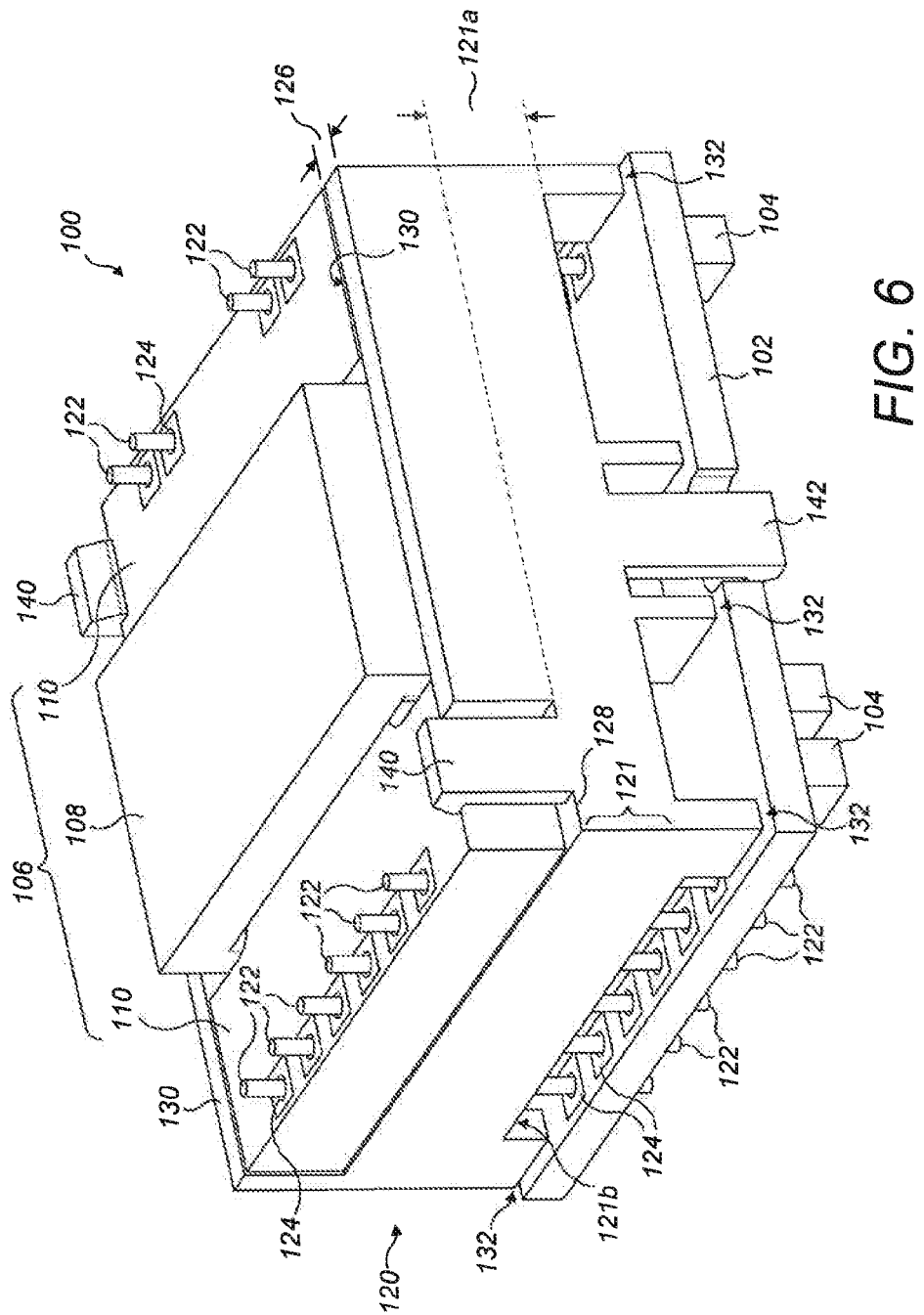
FIG. 6 illustrates a second preferred embodiment of the present invention of a header with a planar transformer and main printed circuit board mounted in position.
Figure 7:
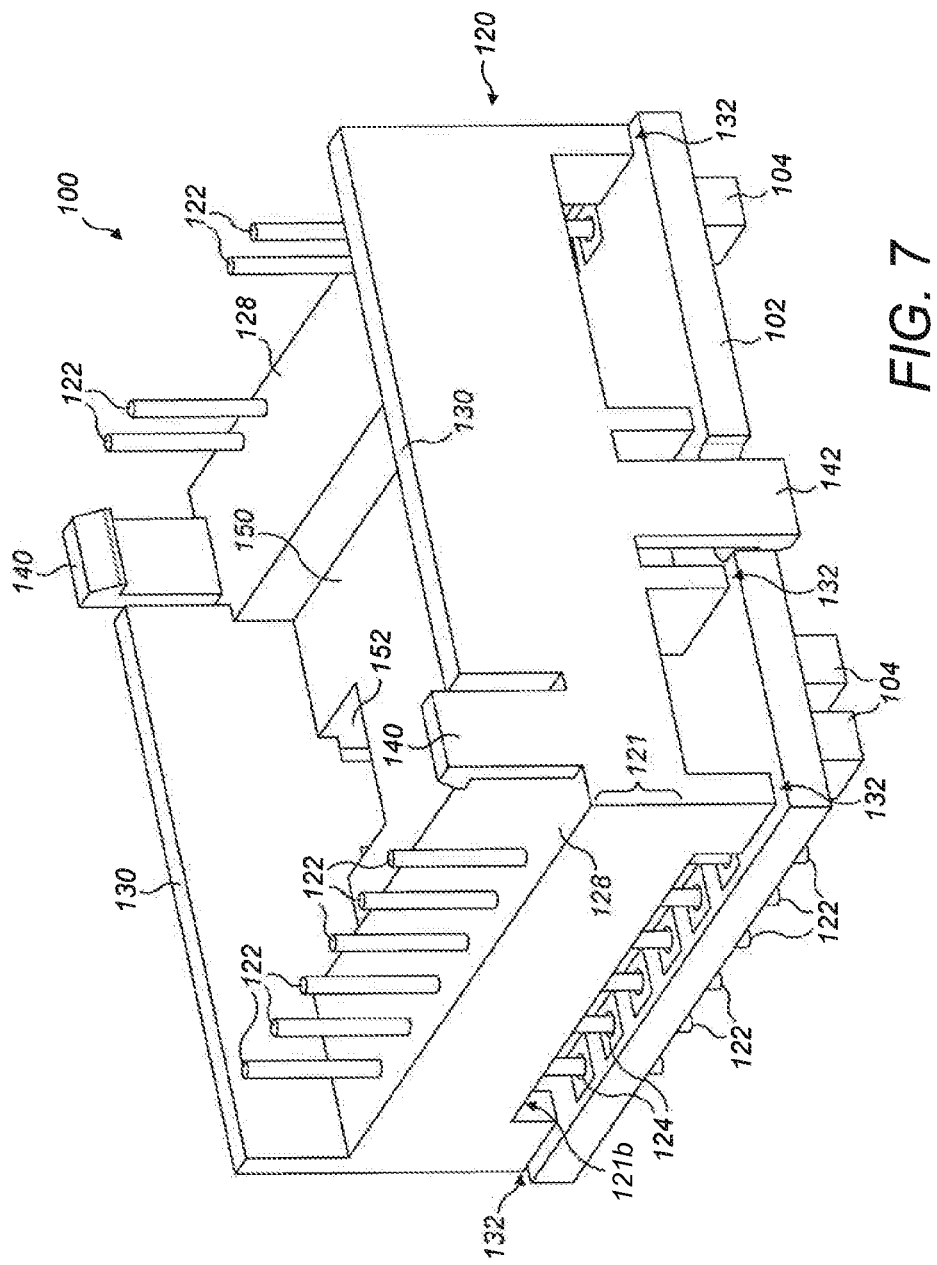
FIG. 7 illustrates a perspective view of the top of the header according to the second preferred embodiment of the present invention, with the planar transformer omitted but with the main PCB in place.
Figure 8:
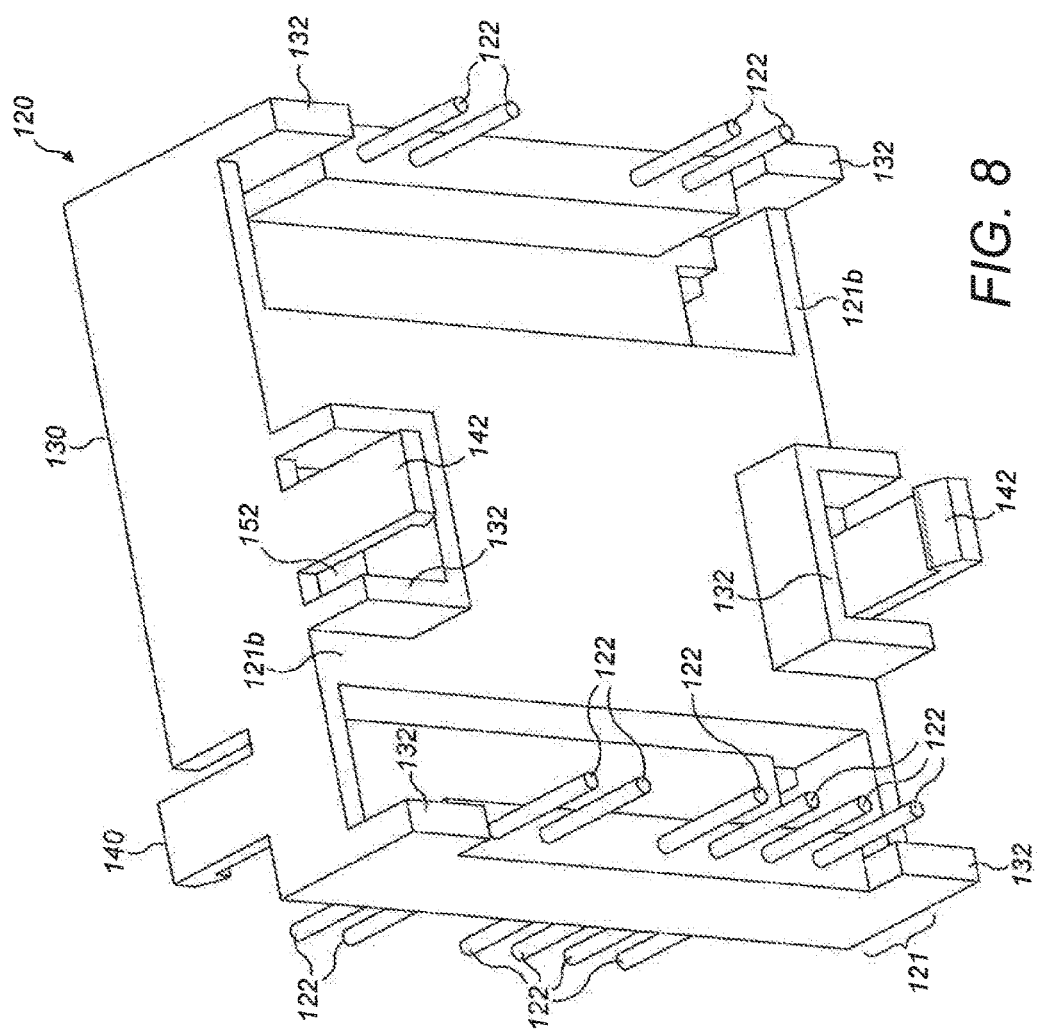
FIG. 8 illustrates a perspective view of the bottom of the header according to the second preferred embodiment of the present invention, with the planar transformer and main printed circuit board omitted.

In the preferred embodiment shown in FIGS. 6 to 8, the two upper clips 140 are positioned at diagonally opposite corners of the header 120, whereas two lower clips 142 are each positioned centrally along two opposing header edges. The square-U-shaped lower mounting surfaces 132 provided midway along two opposing edges of the header are arranged so as to partially enclose the lower clips 142.

In this preferred embodiment, the lower clips 142 protrude farther from the body 121 of the header 120 than the upper clips 140, because the lower mounting surfaces 132 are located a distance below the base 121b of the header body 121. The distances by which the clips 140, 142 protrude will also depend on the thicknesses of the main PCB 102 and the planar PCB 110.

The planar transformer 106 and the main PCBs 102 need not be of equal thickness, and as shown in FIG. 6 the planar transformer 106 can have a greater thickness than the main PCB 102 requiring different sized clips 140, 142. The distance between the lower mounting surfaces 132 and the header body 121 is chosen to ensure that the minimum clearance and creepage requirements are maintained, according to the relevant industry standards.

Another consideration in selecting this distance is the amount of space provided between the header body 121 and main PCB 102. It is desirable to maximize this amount of space in order to allow standard surface mount components room to be soldered to the main PCB 102 beneath the header 120. However, the distance between the lower mounting surfaces 132 and the header body 121 is prevented from becoming too large by constraints on the overall height of the power supply unit, which may arise from the dimensions of the housing, for example.

The view of FIG. 7 shows a transformer core tray 150 which is defined by a recess in the header body 121. Transformer core tray 150 is of a suitable size to receive a planar transformer substrate 110 and core 108, which protrudes below the planar transformer substrate 110, and holds it in place. Thus the depth of the tray 150, that is the distance by which the tray extends below the upper mounting surface 128, corresponds to the distance between the transformer core and the planar PCB. In the present preferred embodiment, the tray 150 is shown as rectangular in shape when viewed from directions both parallel to and orthogonal to the plane of the planar PCB. However differently shaped trays are also possible to accommodate alternative planar transformer cores. The upper mounting surface 128 is defined by two shoulders of the tray 150 positioned on opposing sides of the rectangular shape of the tray, which enable the planar PCB to be supported close to the planar transformer core.

Drain holes 152 are provided in the bottom of transformer core tray. In the present preferred embodiment, two drain holes 152 are preferably provided, for example, one located above each of the lower clips 142. The purpose of the drain holes 152 is to enable liquid from cleaning processes to drain away from underneath the position of the planar transformer core and not become trapped in the tray 150. Such liquids may be used to remove flux residue after soldering has taken place, for example. In alternative preferred embodiments, the number of drain holes 152 and their (its) position within the transformer core tray 150 may vary. The drain holes 152 are shown as rectangular in shape, although other shapes may equally well be used according to ease of manufacture and the efficiency with which liquid is drained from the tray 150.

Third Preferred Embodiment

Figure 9:
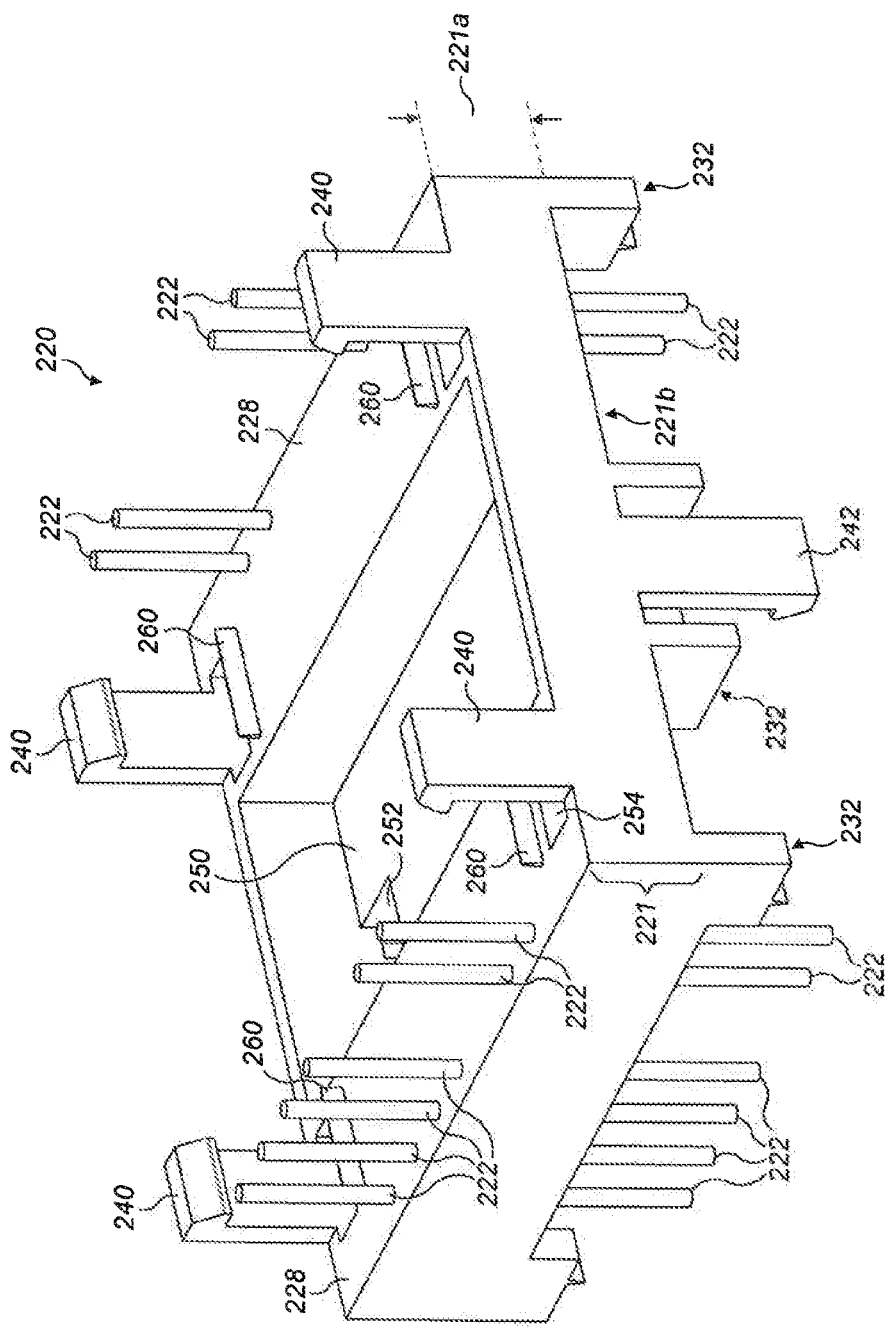
FIG. 9 illustrates a third preferred embodiment of the present invention of a header with a planar transformer and main printed circuit board omitted.
Figure 10:
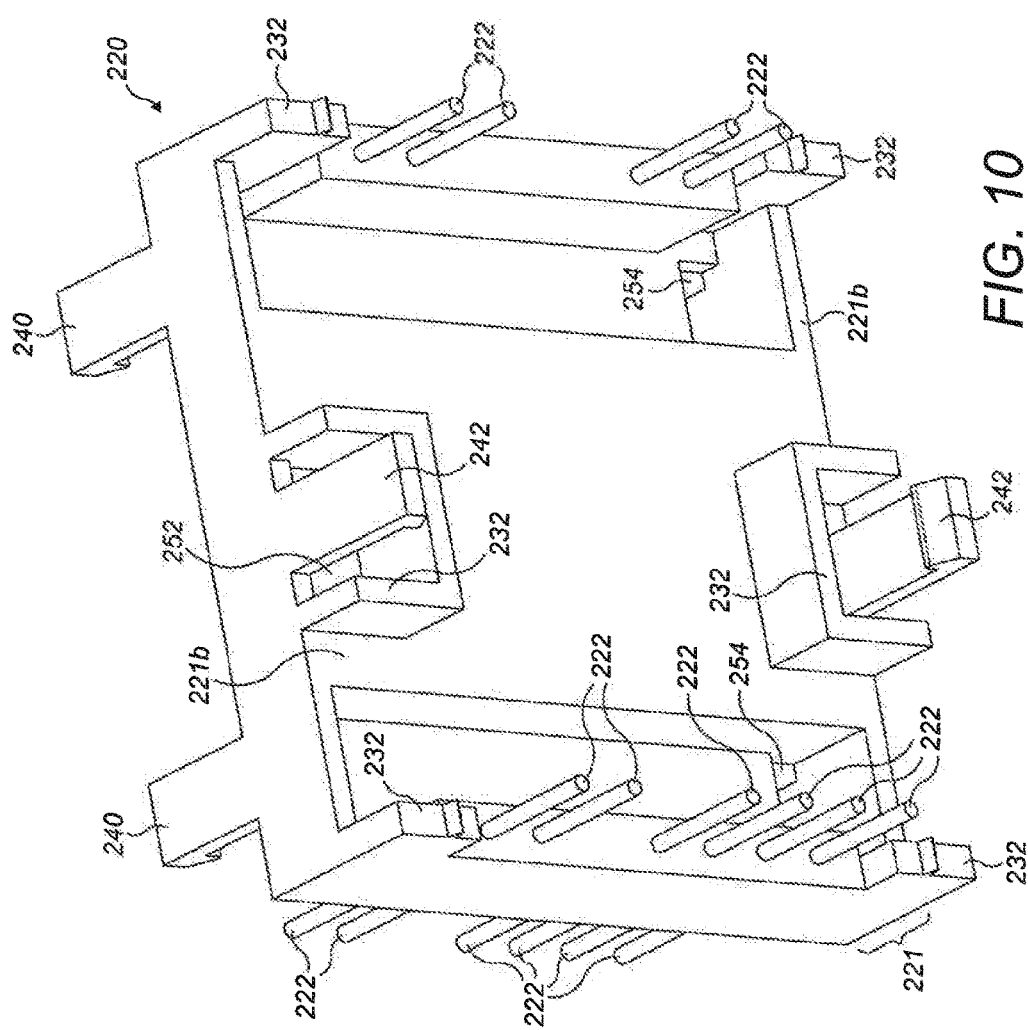
FIG. 10 illustrates a perspective view of the bottom of the header according to the third preferred embodiment of the present invention, with the planar transformer and main printed circuit board omitted.

FIGS. 9 and 10 show a third preferred embodiment of a header 220 according to the present invention. FIG. 9 shows a top perspective view, and FIG. 10 shows a bottom perspective view. In FIGS. 9 and 10 like reference signs denote the same features of the header 220. The planar transformer 106 and main PCB 102 are not shown in these figures. As with the first preferred embodiment, the header body 221 defines a substantially square or rectangular shape and has attached to it a plurality of pins 222 to engage with a main PCB and a planar transformer. The isolation distance 221a between the top and the bottom of the header body 221 ensures that the required electrical isolation requirements are met, and separates components mounted on the planar PCB and/or the planar transformer from those components mounted on the main PCB 102 thereby insulating these components from one another. The way in which the pin 22s engage with the PCBs can be in the same manner as described above for the first preferred embodiment, for example, by drilling holes in the PCBs aligned with the positions of pins 222 and securing the PCBs to the pins 222 by soldering.

In the present preferred embodiment, six pins 222 are provided on one side of the header body 221 (shown on the left-hand side), grouped together in a group of four and a group of two, and another four pins 222 are provided on the opposing side of the header body (shown on the right-hand side), grouped together in two pairs. The precise arrangement of the pins depends on a number of factors such as the size and shape of the header 220 relative to the main PCB 102, space on the main PCB 102 and planar transformer 106 to solder the pins 222, and the distribution of the weight of the planar transformer within the header 220. Many configurations are therefore possible. By way of example, if one side of the planar transformer is of greater mass or more susceptible to damage by vibration than the other side, a more secure connection between the header and the planar transformer on that side is desirable. This can be obtained by providing more pins 222 on the corresponding side of the header 220. In general it is desirable to provide the pins 222 in pairs in order to reduce localized rotation of the PCBs that could occur if only single separated pins are provided.

The header body 221 defines an upper mounting surface 228 against which the substrate of a planar transformer 106 contacts when it is inserted into the header 220, together with a plurality of lower mounting surfaces 232 which contact a main PCB 102 when the header 220 is mounted to it. The present preferred embodiment provides a lower mounting surface 232 at each corner of the header 220, and two further square-U-shaped lower mounting surfaces are also provided midway along two opposing edges of the header 220 (these can be seen most clearly in the view of FIG. 10). The distance by which the lower mounting surfaces are positioned below the base 221b of the header body 221 ensures that the minimum clearance and creepage requirements are maintained, according to the relevant industry standards. The distance also maximizes the amount of space between the header body 221 and the main PCB when the header 220 is mounted on the main PCB. This allows standard surface-mount components enough room to be soldered to the main PCB beneath the header 220, as described above.

Before the pins 222 are secured to the planar PCB by soldering, the planar PCB is held securely against the upper mounting surface 228 by the upper clips 240. In the present preferred embodiment, four upper clips 240 preferably are provided close to each corner of the header 220, with pairs of upper clips 240 on opposing edges of the header body 221. Other configurations for the clips are equally possible. For example, only two upper clips 240 can be provided, each on opposite edges of the header body 221, or upper clips 240 can be provided on all four edges of the header body 221. Where only two upper clips 240 are provided, they could be positioned at diagonally opposite corners of the header body 221 in order to provide the greatest support for the planar transformer. The preferred embodiment shown in FIG. 9 does not include any side walls separate from those provided by the narrow surfaces of upper clips 240. This is because extra side mounting surfaces are not always necessary if a sufficient number of clips 240 are used. If fewer upper clips 240 are used, for example only two upper clips 240, then the mechanical support of the planar PCB may be improved by providing side mounting surfaces similar to those labelled 130 as shown in FIGS. 6 to 8.

Similarly, before the pins 222 are secured to the main PCB by soldering, the lower mounting surfaces 232 are securely held against the main PCB by the lower clips 242. In the present preferred embodiment, two lower clips 242 are provided midway along opposing edges of the header body 221, and are partially enclosed by lower mounting surfaces 232. As with the upper clips 240, alternative configurations of the lower clips 242 are possible.

In the present preferred embodiment, the clips 240, 242 are provided on the two opposing edges of the header body 221 which do not have pins 222 attached to them. Thus the header is joined to the PCBs by, on alternating edges, pins 222 and clips 240, 242. This serves to ensure that, once soldering of the pins to the PCBs is complete, support is provided between the PCBs and the header 220 all around the perimeter of the header body 221. Therefore a strong mounting for the planar conductor is provided which is capable of withstanding forces arising from vibration of the power supply during use.

The view of FIG. 9 shows a transformer core tray 250 which is defined by a recess in the header body 221. As with the tray 150 of the previous preferred embodiment, the tray 250 is of a suitable size to receive a planar transformer core, which protrudes below the planar PCB, and holds it in place. As before, differently shaped trays are also possible to accommodate alternative planar transformer cores. The upper mounting surface 228 is defined by two shoulders of the tray 250 positioned on opposing sides of the rectangular shape of the tray 250, which enable the planar PCB to be supported close to the planar transformer core.

As shown in FIG. 9, drain holes 252 are provided in the bottom of transformer core tray 250 and further drain holes 254 may be provided in the upper mounting surface 228, located close to the upper clips 240 close to the corners of the header body 221. These further drain holes 254 allow liquid to drain away from the upper mounting surface 228, preventing any drops of liquid from becoming tapped between the upper mounting surface 228 and the planar transformer substrate 110.

Figure 11:
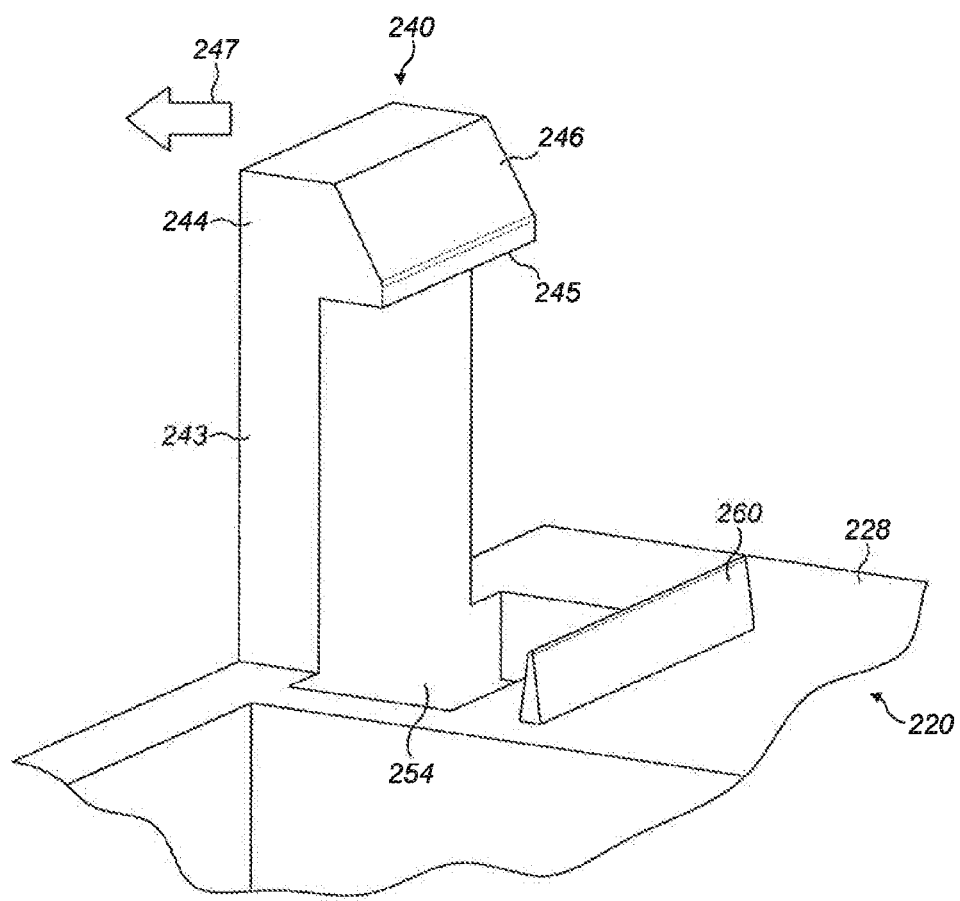
FIGS. 11 and 12 are close-up views of a detail of the header shown in the second and third preferred embodiments of the present invention.

Sacrificial protrusions 260 can optionally be provided on the upper mounting surface 228. The sacrificial protrusions 260 can be made from the same material as the header body 221 and include wedge shaped protrusions that extend upwards from the upper mounting surface 228, narrowing as they do so. As shown in FIGS. 10 and 11, the protrusions 260 need only extend a small distance above the upper mounting surface 228 and can be provided close to the upper clips 240. For example, sacrificial protrusions 260 are provided adjacent each of the secondary holes 254 which in turn are provided adjacent each of the upper clips 240. Sacrificial protrusions 260 are designed to compress when a planar PCB is clipped into the header 220, with the effect that the planar PCB is pushed upwards against the upper clips 240, thereby ensuring that the planar PCB is tightly gripped by the header. They also allow the header 220 to support planar PCBs of different thicknesses, which may be necessary if, during the PCB manufacturing process, there are variations within the established tolerance on the PCB thicknesses. Although not shown in the figures, it is also possible to provide sacrificial protrusions on the lower mounting surface(s) 232, which act to ensure a tight fit between the main PCB and the lower clips 242.

FIG. 11 shows an upper clip 240 in more detail. Although the following discussion is directed to an upper clip 240, the lower clips 242 are of substantially the same shape as upper clips 240 and function in an equivalent way. The clip includes a protrusion 243 extending from the upper mounting surface 228 of the header 220, to which is attached the clip head 244. The planar PCB (for the upper mounting clips) or main PCB (for the lower mounting clips), when positioned correctly with respect to the header 220 (see FIG. 6 for example), makes contact with the protrusion 243 in a similar manner to side walls 130. Clip head 244 includes a lip 245 which, when the planar PCB is inserted into the header, partially extends over the surface of the planar PCB.

Figure 12:
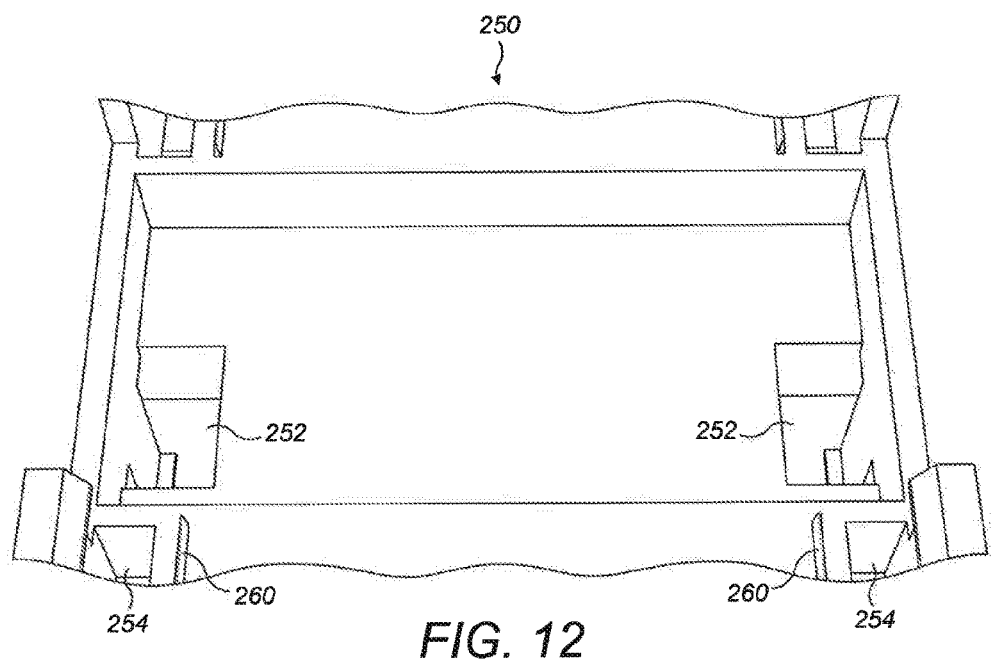

The lower surface of the lip 245 extends in a direction substantially parallel to the upper mounting surface 228. Clip head 244 also includes an angled surface 246, to facilitate insertion of the PCB into the clips. Thus, when a PCB is pushed into the clip 240 in a downwards direction towards the upper mounting surface 228, the angled surface 246 results in the clip being pushed outwards slightly, substantially in the direction of arrow 247 and away from the PCB. The protrusion 243 bends to allow this to happen. This enables the PCB to be positioned against the relevant mounting surface, at which point the clip 240 springs back into position, the lip 245 overlapping the PCB, and securely holding the PCB in place. Optional, secondary drain hole 254 and optional sacrificial protrusion 260 are also shown in FIG. 12. The clips 240 shown in the FIG. 11 should be understood to be identical to those used in the second preferred embodiment of FIGS. 6 to 8, where these optional features are not shown as included.

A compressive force is applied by the clip 240 to the PCB in a direction orthogonal to the plane of the PCB, holding the PCB against its respective upper or lower mounting surface. This can be achieved by making the distance between the upper mounting surface 228 and the lip 245 equal to or slightly smaller than the thickness of the PCB. Furthermore, the lateral positions of the clips 240 on the header 220 are chosen such that when the clips 240 spring back into position, a compressive force is also provided by the clips 240 in a direction parallel to the plane of the PCB. Thus the PCB is pushed against a side mounting surface 130 and/or another clip 240, depending upon which of these features are present. By placing clips 240 on different edges of the header body 221, lateral compressive forces in different directions can be applied to the PCB. Therefore, the planar PCB is securely held by the upper clips 240 to the header 220, and the header 220 is securely held by the lower clips 242 to the main PCB, even without the pins 122, 222 being secured by soldering to the PCBs. The upper 240 and lower 242 clips therefore allow the header 220 and PCBs to be tightly held in a fixed position relative to each other during the soldering process, and also provide protection against vibration when the device is in use.

FIG. 12 shows an enlarged view of the transformer core tray 250, seen from above. Drain holes 252 are provided at opposing ends of the tray. The drain holes 252 are of a sufficient size to allow liquid to drain away from the transformer core tray 250, without compromising the mechanical strength or electrical insulation properties of the header 220. The number of drain holes 252, their shapes and sizes, and the location of the drain hole(s) 252 within the tray, can vary in other preferred embodiments as discussed above.

Suitable materials for making the header of the previously discussed preferred embodiments are plastics, and in particular plastics which are capable of withstanding the high temperatures required for an automated soldering process. Such a soldering process, for example a reflow soldering process, will have a thermal profile to which the header, circuit boards, and electrical components are exposed during production. The plastic should therefore be capable of withstanding the maximum temperature of the thermal profile without deformation, in order to ensure that the planar transformer and header remain securely fixed relative to the main PCB during soldering. The plastic should also have a minimum thickness, for example of 0.4 mm, to meet the relevant insulation requirements of industry standards, for example the EN/UL60950 industry standard. Other electrically insulating materials, which may not necessarily be plastics, can also be used providing they are capable of withstanding the high temperatures required during a soldering process whilst providing sufficient support against vibration.

We have therefore appreciated that improved structural support of a planar transformer coil during the main circuit board manufacturing process, and improved protection against vibration during use, can be realized by using the header of the preferred embodiments of the present invention. The header also conforms to established industry standards regarding electrical insulation of the components.

Various modifications to the preferred embodiments described above are possible and will occur to those skilled in the art without departing from the scope of the present invention which is defined by the following claims. In particular, it should be understood that features described in relation to a single preferred embodiment can be present in other preferred embodiments. Further, although a planar transformer has been described in the preferred embodiments of the present invention, other types of transformers, such as embedded magnetic core transformers are also possible.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

The invention claimed is:

1. An electronic device comprising:
   a header including an insulating header body, the insulating header body including an upper mounting surface and a lower mounting surface;
   a first substrate mounted to the upper mounting surface, the first substrate including a transformer, the transformer including a core, input electrical windings, and output electrical windings, the input electrical windings and the output electrical windings being isolated;
   a second substrate mounted to the lower mounting surface, the second substrate including:
   an input circuitry including one or more electrical components in communication with the input electrical windings; and
   an output circuitry including one or more electrical components in communication with the output electrical windings;
   a first connector provided through the insulating header body, the first substrate, and the second substrate and connecting the input circuitry to the input electrical windings;
   a second connector provided through the insulating header body, the first substrate, and the second substrate and connecting the output circuitry to the output windings; wherein the second substrate has a first isolation gap between the input circuitry and the output circuitry;
   the first substrate has a second isolation gap between the core and the first connector and between the core and the second connector; and
   the insulating header body has an isolation barrier between the core and the input circuitry and between the core and the output circuitry.

2. The electronic device of claim 1, further comprising:
   a first cavity in the insulating header body in which at least part of the core is housed.

3. The electronic device of claim 2, further comprising:
a second cavity in the insulating header body at the opposite side of the first cavity in which the electrical components of the input circuitry and output circuitry are housed.

4. The electronic device of claim 3, wherein the isolation barrier comprises a top and a bottom surface defining a side wall of the first and second cavities.

5. The electronic device of claim 1, wherein the header comprises one or more upper side walls extending from the upper mounting surface.

6. The electronic device of claim 2, wherein the first cavity comprises one or more drain holes.

7. The electronic device of claim 6, wherein at least one wall of the first cavity is sloped to direct liquid towards the one or more drain holes.

8. The electronic device of claim 6, further comprising a lower side wall extending from the insulating header body to the second substrate.

9. The electronic device of claim 8, wherein the lower side wall encapsulates the one or more drain hole.

10. The electronic device of claim 8, wherein the lower surface of the lower side wall is coplanar with a lower mounting surface of the insulating header body.

11. The electronic device of claim 1, wherein each of the first and second connectors comprises:
a plurality of pins joined to the insulating header body and engaged with corresponding holes in the first and/or second substrates.

12. The electronic device of claim 10, wherein the pins are arranged to be secured to the first and/or second substrates by soldering.

13. The electronic device of claim 1, wherein one or more clips are attached to the insulating header body to engage with the first and/or second substrates.

14. The electronic device of claim 13, further comprising at least one sacrificial protrusion that extends from the upper mounting surface and/or the lower mounting surface and that applies a force to the first and/or second substrate to hold the substrate against the one or more clips.

15. The electronic device of claim 1, wherein the header includes one or more further lower mounting surfaces coplanar with the lower mounting surface.

16. The electronic device of claim 1, further comprising secondary holes provided in the upper mounting surface.

17. The electronic device of claim 1, wherein the header is made of a high-temperature plastic.

18. The electronic device of claim 17, wherein the high-temperature plastic is suitable for withstanding a thermal profile of a reflow soldering process.

19. The electronic device of claim 1, wherein the header has a thickness that is substantially equal to 0.4 mm.

20. The electronic device of claim 1, wherein the walls and surfaces of the header are perpendicular or substantially perpendicular to each other, so that the header has a substantially square or rectangular profile.

21. A method of mounting the electronic device of claim 1, the method comprising:
engaging the transformer with the header;
mounting the transformer to the first substrate using the header, by:
securing the first substrate to the upper mounting surface of the header body, and
securing the lower mounting surface of the header body to the second substrate.

22. The method of claim 21, further comprising mounting the header with the transformer and the second substrate secured thereto to a motherboard.

* * * * *